United States Patent
Schustereder et al.

(10) Patent No.: US 12,463,037 B2
(45) Date of Patent: Nov. 4, 2025

(54) METHOD OF MANUFACTURING OHMIC CONTACTS ON A SILICON CARBIDE (SIC) SUBSTRATE, METHOD OF MANUFACTURING A SEMICONDUCTOR DEVICE, AND SEMICONDUCTOR DEVICE

(71) Applicant: Infineon Technologies AG, Neubiberg (DE)

(72) Inventors: Werner Schustereder, Villach (AT);
Ravi Keshav Joshi, Klagenfurt (AT);
Hans-Joachim Schulze, Taufkirchen (DE); Ralf Siemieniec, Villach (AT);
Axel Koenig, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 554 days.

(21) Appl. No.: 17/869,567

(22) Filed: Jul. 20, 2022

(65) Prior Publication Data
US 2023/0024105 A1    Jan. 26, 2023

(30) Foreign Application Priority Data

Jul. 21, 2021  (DE) .......................... 102021118863.6
Jun. 8, 2022  (DE) .......................... 102022114411.9

(51) Int. Cl.
*H01L 21/04* (2006.01)
*H10D 62/832* (2025.01)
*H10D 64/62* (2025.01)

(52) U.S. Cl.
CPC ..... *H01L 21/0485* (2013.01); *H10D 62/8325* (2025.01); *H10D 64/62* (2025.01)

(58) Field of Classification Search
CPC ........... H01L 21/0485; H10D 62/8325; H10D 64/01; H10D 64/23; H10D 64/62
(Continued)

(56) References Cited

U.S. PATENT DOCUMENTS 7,781,294 B2   8/2010  Mauder et al.
2011/0193101 A1*  8/2011  Yanase ................... H10D 64/62
                                                              257/77
(Continued)

FOREIGN PATENT DOCUMENTS

JP    H11-121744 A    4/1999
JP    2000-049363 A   2/2000
(Continued)

OTHER PUBLICATIONS

Li F., Sharma Y., et al., 3C—SIC Transistor with Ohmic Contacts Defined at Room Temperature. IEEE Electron Device Letters, vol. 37, No. 9, Sep. 2016, pp. 1189-1192.
(Continued)

*Primary Examiner* — Fazli Erdem
(74) *Attorney, Agent, or Firm* — Cooper Legal Group LLC (57) ABSTRACT

The present disclosure relates to methods of manufacturing Ohmic contacts on a silicon carbide (SiC) substrate including providing a 4H—SiC or 6H—SiC substrate, implanting dopants into a surface region of the 4H—SiC or 6H—SiC substrate, annealing the implanted surface regions to form a 3C—SiC layer, and depositing a metal layer on the 3C—SiC layer. An implanting sequence of the implantation of dopants includes a plurality of plasma deposition acts with implantation energy levels including at least two different implantation energy levels. The implantation energy levels and one or more implantation doses of the plurality of plasma deposition acts are selected to form a 3C—SiC layer in the surface region of the 4H—SiC or 6H—SiC substrate during the annealing act. A method of manufacturing a semiconductor device having a structure including at least three layers including a 4H—SiC or 6H—SiC layer, a 3C—SiC layer, and a metal layer, by applying one or more of the techniques described herein, and semiconductor (Continued)

devices obtained with one or more of the techniques described herein are described.

23 Claims, 4 Drawing Sheets

(58) Field of Classification Search
USPC .......................................................... 257/522
See application file for complete search history.

(56) References Cited

U.S. PATENT DOCUMENTS

| | | | | |
|---|---|---|---|---|
| 2013/0062622 | A1* | 3/2013 | Tsuchiya | H10D 12/031 |
| | | | | 257/E21.409 |
| 2013/0240906 | A1* | 9/2013 | Shimizu | H01L 21/02378 |
| | | | | 257/77 |
| 2021/0328022 | A1* | 10/2021 | Rascuná | H10D 30/66 |
| 2022/0028976 | A1* | 1/2022 | Wirths | H10D 30/751 |
| 2022/0028978 | A1* | 1/2022 | Rascuná | H10D 62/8325 |

FOREIGN PATENT DOCUMENTS

| | | |
|---|---|---|
| JP | 2001-085687 A | 3/2001 |
| JP | 2009-049198 A | 3/2009 |
| JP | 2013-058601 A | 3/2013 |

OTHER PUBLICATIONS

T. Nishimura, et al. "Electrical and structural properties of polycrystalline 3C—SIC layer regrown from amorphized 4H—SiC (0 0 0 1) by P and Al ion implantations", Nuclear Instruments and Methods in Physics Research B 272, (2012), pp. 422-425.
Wei Huang, et al., "Nano-scale native oxide on 6H—SiC surface and its effect on the Ni/native oxide/SiC interface band bending", Material Science Forum, vols. 778-780, (2014), pp. 566-570.
Yutian Wang, et al., "Ohmic contact formation mechanism of Ge-doped 6H—SiC", Journal of Crystal Growth 534, 2020.
K.J. Roe, et al., "Ge Incorporation in SiC and the Effects on Device Performance", Proceedings. IEEE Lester Eastman Conference on High Performance Devices, 2002, pp. 201-206, doi: 10.1109/LECHPD.2002.1146751.
G. Katulka, et al., "The electrical characteristics of silicon carbide alloyed with germanium", Applied Surface Science, 175-176, 2001, pp. 505-511.

* cited by examiner

METHOD OF MANUFACTURING OHMIC CONTACTS ON A SILICON CARBIDE (SIC) SUBSTRATE, METHOD OF MANUFACTURING A SEMICONDUCTOR DEVICE, AND SEMICONDUCTOR DEVICE

RELATED APPLICATIONS

This application claims priority to German Patent Application No. 102021118863.6, filed on Jul. 21, 2021, entitled "METHOD OF MANUFACTURING OHMIC CONTACTS ON A SILICON CARBIDE (SIC) SUBSTRATE, METHOD OF MANUFACTURING A SEMICONDUCTOR DEVICE, AND SEMICONDUCTOR DEVICE", and German Patent Application No. 102022114411.9, filed on Jun. 8, 2022, entitled "METHOD OF MANUFACTURING OHMIC CONTACTS ON A SILICON CARBIDE (SIC) SUBSTRATE, METHOD OF MANUFACTURING A SEMICONDUCTOR DEVICE, AND SEMICONDUCTOR DEVICE", both of which are incorporated by reference herein in their entirety.

TECHNICAL FIELD

The present disclosure generally relates to methods of manufacturing Ohmic contacts on a silicon carbide substrate, methods of manufacturing a semiconductor device, and a semiconductor device obtained therewith.

BACKGROUND

Semiconductor devices having wide bandgap properties such as silicon carbide (SiC) based diodes or power MOSFETs are considered as the next generation electronic devices, for example in applications in harsh environments or in the power electronics area. Often, the formation of Ohmic contacts at the interface of SiC substrates and metal contact layers require a highly doped surface region and a relative high temperature in the post-metallisation annealing step (cf. F. Li et al. 3C—SiC Transistor with Ohmic Contacts Defined at Room Temperature. IEEE Electron Device Letters, Vol. 37, No. 9, September 2016, pages 1189-1192, Retrieved from the Internet <URL: https://www.researchgate.net/profile/Yogesh-Sharma-38/publication/305523420_3C—SiC_Transistor_with_Ohmic_Contacts_Defined_at_Room_Temperature/links/5c1cc176458515a4c7eeb346/3C—SiC-Transistor-with-Ohmic-Contacts-Defined-at-Room-Temperature.pdf> <DOI: 10.1109/LED.2016.2593771>, which is incorporated herein by reference in its entirety). However, the postmetallisation annealing step often causes intermediate semiconductor layer formation, e.g. silicide or carbide layers, and loss of Ohmic contact behavior at the interface of the semiconductor layer and the metal contact layer due to recrystallization processes and also a delamination of the rear side contact. The recrystallization usually results in a reorganization of the dopants towards the monocrystalline structural inner layers of the substrates and, thus, the concentration of the dopants near the interface of the metal layer and the surface are significantly decreased. Therefore, additional steps are conventionally carried out which increase the costs for producing Ohmic contacts on wide bandgap semiconductors. Alternatively, Li et al. proposed the manufacturing of Ohmic contacts without the requirement of any post-metallisation annealing step.

In light of the above, there is a demand to provide alternative manufacturing processes for Ohmic contacts on SiC based semiconductor substrates, which enable the production of Ohmic contacts in an efficient and cost sensitive manner. Furthermore, there is a need of providing manufacturing methods of semiconductor SiC based devices having reliable Ohmic contacts, and wide bandgap semiconductor devices obtainable therewith.

SUMMARY

Some embodiments relate to methods of manufacturing Ohmic contacts on a silicon carbide (SiC) substrate comprising acts of providing a SiC substrate, implanting dopants into a surface region of the SiC substrate, annealing the implanted surface regions to form a 3C—SiC layer (e.g., annealing the implanted surface regions may cause the 3C—SiC layer to be formed), and depositing a metal layer on the 3C—SiC layer. The substrate may be a monocrystalline substrate such as a monocrystalline substrate based on 4H—SiC or 6H—SiC crystalline structures. For example, the implantation sequence may comprise a plurality of plasma deposition acts with at least two different implantation energy levels. A plurality means in this regards that at least two plasma deposition acts with different implantation energy levels may be applied. By using at least two different plasma deposition acts, a high concentration of dopants can be implanted into the surface region of the SiC based substrates, thereby improving the Ohmic contact behavior. Moreover, the dopant concentration profile in the surface layer may be broadened in the direction vertical to the wafer surface when using two or more separated plasma deposition acts. For more individually designed concentration profiles, for example, three or more plasma deposition acts may be used.

The implantation energy and implantation dose in each of the plurality of plasma deposition acts may be selected to form a crystalline or polycrystalline 3C—SiC layer (e.g., 3C—SiC a layer comprising crystalline 3C—SiC and/or polycrystalline 3C—SiC) in the surface region of the SiC substrate comprising the implanted dopants during the subsequent annealing act. Thus, wide bandgap properties of the obtained SiC substrates may be obtained by the methods described herein. These wide bandgap substrates are suitable for producing semiconductor devices with reliable Ohmic contact behavior after metallization of contact metals on the 3C—SiC layer. In this specification, the term "on" does mean that a layer or element may be directly on or extended directly onto another layer or element or intervening layers or elements may also be present. In contrast, when an element is referred to as being "directly on" or extending "directly onto" another element, there are no intervening elements present.

The method may be used for providing n-doped rear side contacts. Embodiments are contemplated in which the method is used for contacting the rear and front side semiconductor surface with metal layers. The terms "front side" and "rear side" are used with reference to the orientation in the examples shown in the drawing section. Because components of embodiments can be positioned in a number of different orientations, the directional terminology is used for purposes of illustration only and shall in no way considered to be limiting.

An embodiment relates to a method of manufacturing Ohmic contacts on a silicon carbide (SiC) substrate comprising the following acts: (i) providing a 4H—SiC or 6H—SiC substrate; (ii) forming an amorphous layer in a surface region of the SiC substrate; (iii) performing first thermal annealing of the SiC substrate to recrystallize the amorphous layer into a crystalline or polycrystalline 3C—SiC layer; (iv) implanting dopants into the crystalline or polycrystalline 3C—SiC layer; (v) performing second thermal annealing of at least the 3C—SiC layer; and (vi) depositing a metal layer on the 3C—SiC layer. In some examples, the second thermal annealing may be second high temperature annealing, such as thermal annealing that is performed at a temperature exceeding a threshold temperature.

In an embodiment of the method as described herein before, the following acts may be performed to manufacture Ohmic contacts may be on a silicon carbide (SiC) substrate comprising: (i) providing a 4H—SiC or 6H—SiC substrate; (ii) forming a crystalline or polycrystalline 3C—SiC layer in a surface region of the SiC substrate by using laser thermal annealing processing; (iii) implanting dopants into the crystalline or polycrystalline 3C—SiC; (iv) performing second high temperature annealing of the 3C—SiC layer; and (v) depositing a metal layer on the 3C—SiC layer.

In some embodiments, the substrate to be provided with Ohmic contacts may be any monocrystalline substrate. For example, the substrate may be based on 4H—SiC or 6H—SiC crystalline structures. In some embodiments, the crystallinity of the substrate may be changed in a region near the surface of the SiC substrate by forming an amorphous layer in a surface region, followed by an annealing act at elevated temperature (e.g., a temperature exceeding a threshold temperature) to recrystallize the amorphous layer into a 3C—SiC layer. The 3C—SiC layer obtainable or obtained by the herein described embodiments may be a crystalline or polycrystalline layer having a cubic structure which is responsible for providing a reduced bandgap compared to the 4H—SiC or 6H—SiC bandgap resulting in a lower contact resistance when being contacted by a metal contact layer.

In a further act, dopants may be implanted into the crystalline or polycrystalline layer by a suitable implantation method. Exemplary implantation methods are beamline implants or plasma deposition implants. The obtained implants are used as contact implants and may be substantially provided in the 3C—SiC layer without significantly extending into the subsequently provided monocrystalline substrate (e.g., extension of the obtained implants into the subsequently provided monocrystalline substrate may be smaller than a threshold extension). The implantation dose and the implantation temperature during the beamline implants may be selected such that an amorphization of the crystalline material as well as a significant movement (e.g., movement exceeding a threshold movement) of the implanted elements inside the 3C—SiC layer are prevented during the following second high temperature annealing process. Suitable temperature ranges for the beamline implantation act are in a range from about 150° C. to about 1000° C. In an example, the beamline implantation act may be performed at one or more first temperatures, wherein the one or more first temperatures are set to one or more temperatures in a range from about 150° C. to about 1000° C. (e.g., the one or more first temperatures are selected and/or adjusted to be in a range from about 150° C. to about 1000° C.).

During a second high temperature annealing act, e.g., an annealing act at elevated temperatures, the implanted doping elements are activated. The temperature for this second annealing act may be set to a temperature in a range from about 1600° C. to about 1800° C. (e.g., the temperature of the second annealing act may be selected and/or adjusted to be in a range from about 1600° C. to about 1800° C.).

In some examples, a metal layer is provided as contact material, thus forming an Ohmic contact at the wide bandgap 3C—SiC material of the semiconductor substrate. The herewith described method results in reliable Ohmic contacts wherein the smaller bandgap of the 3C—SiC layer compared to monocrystalline substrate material can be suitably used. Moreover, the doping elements are placed near the interface of the 3C—SiC layer and the metallization layer so that a high concentration of dopants in this surface region can be maintained. Separating the acts of forming the 3C—SiC layer and forming the doping region may provide for preventing an unwanted substantial movement (e.g., unwanted movement that exceeds a threshold movement) or reorganization of the doping elements within the surface region. Thus, reliable contacts with high concentration of doping elements near the interface between the 3C—SiC layer and the metal layer can be achieved with this method. This method may be used for providing Ohmic contacts at the rear side and/or the front side of monocrystalline SiC substrates (e.g., this method may be used for p-doped contacts at the front side of semiconductor devices).

An embodiment described herein relates to a method of manufacturing a semiconductor device having a structure of at least three layers comprising a 4H—SiC layer, a 3C—SiC layer, and a metal layer. The act of manufacturing an Ohmic contact on a silicon carbide (SiC) substrate as defined in any of the preceding embodiments may be used in this method, thus obtaining reliable wide bandgap semiconductor devices in a cost effective manner.

Further embodiments relate to semiconductor devices having a structure of at least three layers, comprising a 4H—SiC layer, a 3C—SiC layer, and a metal layer, wherein the maximum of the concentration of dopants in the 3C—SiC layer is less than 30 nanometers (nm), such as less than 20 nm, and/or less than 10 nm away from the interface of the metal layer and the 3C—SiC layer. For example, a region, in the 3C—SiC layer, having the maximum concentration of dopants in the 3C—SiC layer is less than 30 nm away (such as less than 20 nm and/or less than 10 nm) from the interface of the metal layer and the 3C—SiC layer (e.g., a distance between the region and the interface is less than 30 nm, such as less than 20 nm and/or less than 10 nm). Those semiconductor devices have good Ohmic contacts due to the high concentration of dopants near the interface to the metal contact layer.

Of course, the present disclosure is not limited to the above features and advantages. Indeed, those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated examples can be combined unless they exclude each other. Examples are depicted in the drawings and are detailed in the description which follows.

DETAILED DESCRIPTION

Hereinafter, manufacturing processes for Ohmic contacts on silicon carbide (SiC) based semiconductor substrates, which enable the production of Ohmic contacts in an efficient and cost sensitive manner are described in greater detail. The SiC based semiconductor substrates generally are SiC work pieces to be processed. For example, the SiC based semiconductor substrate may be a SiC based wafer. Alternatively and/or additionally, the SiC based semiconductor substrate may comprise a base wafer (also called "growth substrate" or "growth wafer") onto which semiconductor layers are deposited, e.g. by using an epitaxial process. At least one epitaxial layer may adjoin a front side of the semiconductor substrate. In some examples, a metal contact layer may be provided on the SiC based semiconductor substrate. In this case, the SiC based semiconductor substrate may be a processed wafer. Exemplary processed wafers with a SiC based semiconductor substrate may comprise power metal-oxide-semiconductor field-effect transistors (MOSFETs) or diodes. Those SiC based electronic components may have an n-doped SiC substrate layer at the rear side of the semiconductor substrate to be contacted with a metal contact layer. At the front side of the semiconductor substrate, a p-doped semiconductor layer at the interface between the semiconductor substrate and the metal contact layer may be required for a reliable Ohmic contact. While emphasis is placed on manufacturing methods for Ohmic contacts at power MOSFET or diode component parts, the embodiments and examples described herein are not intended to be limited to these specific electronic components. Instead, the methods can be used for manufacturing Ohmic contacts of any other electronic components based on a SiC substrate, for example epitaxial layers comprised by the SiC substrate. Moreover, the term "substrate" may include processed wafers comprising several epitaxial layers in which the growth substrate has been at least partially removed before the rear side contact may be formed. In addition, the interface between the semiconductor substrate front and/or rear side and the metal layer may be doped with other dopants. For example, n-doped layers at the front side or p-doped layers at the rear side may also be selected depending on the electronic device produced. For each doping type "n" or "p", different doping concentrations can be used. Generally, these concentrations are identified as n− or p+, for example. In this specification, any doping type indicated herein may have the same or different absolute concentration than the same type in another embodiment or example.

The semiconductor substrate and, if applicable, the epitaxial layers for these electronic devices may be monocrystalline. Exemplary embodiments of monocrystalline semiconductor materials may be based on 4H—SiC or 6H—SiC substrates. Thus, in some examples, a monocrystalline 4H—SiC or 6H—SiC substrate may be provided. As described above, the substrate may comprise device structures within the substrate. Before the act of manufacturing the contacts by depositing metal layers, further device structures may be produced within the base substrate. Alternatively and/or additionally, thickness reducing acts of the semiconductor substrate (if needed, for example) may be applied before the manufacturing of the contacts.

In one embodiment, the method of manufacturing Ohmic contacts on a SiC substrate further comprises the act of implanting dopants into a surface region of the SiC substrate. The implantation of the dopants means that the SiC monocrystalline structure is doped with doping elements to form implanted regions, for example, n-doped or p-doped regions, near the surface of the semiconductor substrate (e.g., the implanted regions may be formed within a threshold distance of the surface of the semiconductor surface). The thickness of the implanted region depends on one or more factors such as, for example, the implantation method used, the implantation temperature, the implantation energy, and/or further parameters of each implantation act. In the method described herein a plasma deposition is used for forming a specific implantation profile with a high concentration of doped elements near the surface of the semiconductor substrate (e.g., the specific implantation profile may have the high concentration of doped elements within a threshold distance of the surface of the semiconductor surface). This surface is intended to create the interface between the SiC substrate or epitaxial layer, provided in the substrate in some embodiments of manufacturing front side contacts, and the metal contact layer once the Ohmic contact has been prepared.

As the concentration profile of the dopants may have the concentration maximum closer to the surface, that means, higher dopant concentration at lower implantation depth, and due to the better contact caused by the 3C—SiC formation it is possible to prepare improved concentration profiles at relatively low costs because the required implantation doses are lower. Depending on the implantation dose selected, the implanting sequence may comprise a plurality of plasma deposition acts with at least two different implantation energy levels. A plurality means in this regards that at least two plasma deposition acts with different implantation energy levels may be applied. Energy level does mean that the implantation energy or the implantation dose is different in the at least two plasma deposition acts. The term "at least two" comprises two, three, four or even more plasma deposition acts to improve the concentration profiles. Nevertheless, by using two or more separate plasma deposition acts, a sufficiently high concentration of dopants can be implanted into the surface region of the SiC based substrates, thereby improving the Ohmic contact behavior. For example, the use of two or more plasma deposition acts results in a broader overall concentration profile of the dopants in the surface region of the semiconductor substrate which may be helpful to reduce the effect of an undesired native oxide layer on the SiC surface influencing the resulting doping profile within the SiC substrate or epitaxial layer and with it the reproducibility and homogeneity of the resulting contact resistance. In some examples, one or more parameters of the plurality of plasma deposition acts may be selected to form a 3C—SiC layer in the surface region of the 4H—SiC or 6H—SiC substrate during an annealing act (discussed below). For example, the one or more parameters of the plurality of plasma deposition acts may be selected such that a 3C—SiC layer is formed in the surface region of the 4H—SiC or 6H—SiC substrate during the annealing act (e.g., the one or more parameters of the plurality of plasma deposition acts may be selected such that the annealing act causes formation of the 3C—SiC layer in the surface region of the 4H—SiC or 6H—SiC substrate). In some examples, the one or more parameters may comprise implantation energy levels of the plurality of plasma deposition acts, one or more implantation doses of the plurality of plasma deposition acts, and/or an overall implantation energy level applied (e.g., the sum of the implantation energy levels of the plurality of plasma deposition acts).

In a first embodiment, the implanted surface regions comprise at least partially amorphous SiC after performing the plurality of plasma deposition acts. For example, plasma deposition (e.g., the plurality of plasma deposition acts) may be used to form one or more contact implants in the surface region of the SiC substrate. In some embodiments, those SiC surface regions amorphized by the implantation act and/or sequence are at least partly recrystallized, thereby creating a crystalline or polycrystalline 3C—SiC polytype during an annealing act (e.g., a subsequent annealing act discussed below). The annealing, e.g., by using a thermal laser annealing with elevated temperatures (e.g., temperatures exceeding a threshold temperature) or a furnace process (e.g., a furnace anneal process), may result in removing ion damages and amorphization of the respective regions, thus inducing the desired 3C—SiC structure and a partial or full activation of the implanted dopants. The obtained crystalline or polycrystalline layers (e.g., crystalline or polycrystalline layers formed via the annealing) with high concentrations of dopants allow a reliable Ohmic contact behavior. The reliable Ohmic contact behavior may be due, at least in part, to the reduced bandgap compared to 4H—SiC or 6H—SiC bandgap structures, thus resulting in a lower contact resistance in the obtained Ohmic contacts.

The dopants may be implanted in separate plasma deposition acts with different energy levels (e.g., energy levels, wherein a quantity of different energy levels of the energy levels exceeds a threshold quantity of difference energy levels). Thereby a continuous and broad vertical concentration profile of dopants can be achieved. The term "vertical" is understood to mean a direction that runs generally perpendicular to the surfaces or sides and thus to the lateral direction of a semiconductor material or substrate. The vertical direction therefore runs in the thickness direction of the semiconductor material or substrate.

An implantation of the dopants in a plurality of energies and doses may further minimize a potential negative influence of "native oxides" on the resulting effective dopant doses in the semiconductors due to the broadening of the doping profile in the vertical wafer direction, especially in the region close to (e.g., within a threshold distance of) the surface region of the semiconductors. In order to form the maximum of the dopant concentration directly at the interface between native oxides and SiC semiconductor material (or close to, such as within a threshold distance of, the interface between native oxides and SiC semiconductor material), exemplary energy levels for the plasma depositions (e.g., the plurality of plasma deposition acts) are in a range from about 0.5 kilo electronvolts (keV) to about 10 keV, such as a range from about 2 keV to about 10 keV (e.g., energy levels for the plasma depositions are selected and/or adjusted to be in a range from about 0.5 keV to about 10 keV, such as in a range between about 2 keV to about 10 keV). Exemplary implantation doses (e.g., implantation doses of the plurality of plasma deposition acts) are in a range from about $1\times10^{14}$ centimeters$^{-2}$ (cm$^{-2}$) to about $2\times10^{17}$ cm$^{-2}$, such as in a range from about $1\times10^{15}$ cm$^{-2}$ to about $1\times10^{17}$ cm$^{-2}$ and/or in a range from about $3\times10^{15}$ cm$^{-2}$ to about $3\times10^{16}$ cm$^{-2}$. Alternatively and/or additionally, exemplary implantation doses (e.g., implantation doses of the plurality of plasma deposition acts) may be at least $1\times10^{14}$ cm$^{-2}$, and/or at least $1\times10^{15}$ cm$^{-2}$. In some examples, energy levels used in each of the plurality of plasma deposition acts are rather low (e.g., lower than a threshold), while the overall dopant concentration may be in a range from about $5\times10^{19}$ cm$^{-3}$ to about $5\times10^{21}$ cm$^{-3}$, such as in a range from about $1\times10^{20}$ cm$^{-3}$ to about $1\times10^{21}$ cm$^{-3}$.

Plasma deposition at the above-identified energy levels allow the implantation of high doses of dopants with low costs. Even though the targeted doping profiles might require a plurality of implantation acts and high implantation doses, the overall costs of the implantation can be significantly lowered compared to conventionally used beamline implantation techniques. The commonly used beamline implantation technics may result in Gauss-like concentration profiles of the dopants exhibiting a relatively low surface concentration and a doping maximum which is located far below the metal/semiconductor interface due to the relatively high technically feasible minimum implantation energy. Thus, an additional thinning or etching act may be applied before contacts are provided to shift the doping maximum close to the semiconductor/metal interface. This approach results in inhomogeneous and irreproducible contact resistances due to the inaccuracy of the etching acts. Therefore, the herein described plasma depositions with lower energy levels fulfil the needs of these conventional implantation techniques because the dopant profiles may be designed as needed and any thinning or etching acts of the substrate layers may not be demanded.

After the implantation acts and/or sequence as described above, an annealing of the implanted surface regions may be performed. During the annealing, the implanted dopants are at least partly activated. The annealing may be performed at elevated temperatures which may be at least 1400° C., such as in a range from about 1600° C. to about 1800° C.

During the activation of the dopants (e.g., performed via the annealing of the implanted surface regions), the amorphous substrate layer in the surface region formed during the implantation sequence undergoes at least a partial recrystallization into a crystalline or polycrystalline 3C—SiC layer (e.g., a 3C—SiC layer comprising crystalline 3C—SiC and/or polycrystalline 3C—SiC). For example, a temperature of the annealing may be set (and/or adjusted) to induce an at least partial recrystallization of at least partially amorphous SiC in the implanted surface regions to form the crystalline or polycrystalline 3C—SiC. The formation of the 3C—SiC layer at the surface region facilitates depositing of a metal layer with low contact resistance onto the 3C—SiC layer, thus resulting in a wide bandgap semiconductor device with a reliable Ohmic contact behavior. Reliable Ohmic contact behavior in the present disclosure means that the reduced bandgap of the cubic 3C—SiC layer compared to the 4H—SiC or 6H—SiC layer may result in a lower contact resistance. The term "onto" in this regard again means that the metal layer may be deposited directly onto the surface region of the semiconductor substrate or on at least one intermediate layer such as the native oxide layer.

According to some examples, the annealing process may be performed by a laser annealing process. The laser annealing process may be used for processing the rear side of the substrate. Alternatively and/or additionally, the annealing process may be performed by a furnace processing (e.g., furnace annealing process). The furnace processing may be applied for processing the frontside of the substrate.

In some examples of the methods as described herein, at least two different dopant types may be implanted in the implanting act. At least one of these dopant types comprises doping elements. Exemplary embodiments of doping elements may be selected from the group of nitrogen (N), phosphorus (P), aluminum (Al), gallium (Ga), boron (B), germanium (Ge), selenium (Se), and sulfur (S). In some examples, N, P, Se, and S are suitably used if n-doped layers shall be produced, while Al, Ga, and B are suitably used for p-doped layers.

In further examples, at least one dopant type comprises doping elements as described above and at least another dopant type comprises one or more non-doping elements which are generally not considered to be doping elements. In some examples, such non-doping elements may provide at least some doping characteristics and, thus, may be considered as being a doping element in the present disclosure. In other examples, such non-doping elements may not provide such characteristics and, thus, may be considered as non-doping elements in view of the present disclosure. Generally, those dopants having non-doping characteristics may be selected from elements having neither acceptor nor donor properties. Exemplary embodiments of those dopants are argon (Ar), krypton (Kr), xenon (Xe), silicon (Si), or carbon (C). In some examples, at least one of the non-doping elements is germanium (Ge).

The use of germanium as co-doping element allows to tune the band gap structure. Thereby it may facilitate the Ohmic contact to p-type as well as n-type SiC with one single method. For example, a pure germanium implant or co-implant together with a dopant species as identified above may improve (and/or may assist in improving) a contact resistance (of the Ohmic contact, for example) to SiC. In the absence of other dopants (e.g., in the absence of any other dopant), it is possible to make a contact Ohmic with a single metal. The reason may be that a germanium implant is not an element significantly changing the electronic character but a contact improving element because it may have several influences on the SiC crystal lattice. Germanium, for example, may undergo a substantial incorporation into SiC crystal lattice taking the silicon position. Being a bigger atom compared to silicon or carbon, germanium may induce the deformation in SiC crystal and modulate (e.g. reduce) the bandgap in a favorable manner. Furthermore, the germanium-carbon bond is not as strong as a silicon-carbon bond. Therefore, the germanium-carbon bond might break during the reaction with metal at the interface of substrate and metal and might form a respective bond with the metal such as titanium. The germanium metal bond then may offer a direct contact with a very low Schottky height, which may favor the Ohmic contact formation. This may irrespective of the type of other dopants used in the herein described methods and may the reason that the effect can be used in p-type and n-type SiC substrate layers.

Exemplary doses of germanium implants may be, for example, in a range from about $10^{17}$ cm$^{-3}$ to about $10^{20}$ cm$^{-3}$. Such germanium profiles may be realized as good Ohmic contacts by, for example, implanting processes such as a plasma deposition implantation or a tilted implantation. In some examples, the germanium implantation act may be performed with the same mask used for implanting the n- or p-type implant species and can be activated with a same high temperature anneal (e.g., a second high temperature anneal, performed for activating implants, discussed below).

Some of the above-described examples may further comprise additional beamline implantation acts performed with one or more tilted ion beams. Those additional ion beam implants of dopants may be suitably applied to the plasma depositions of dopants to increase the vertical extent of the dopant concentration profile within the surface region of the SiC substrate. Broader concentration profiles with high dopant concentrations can be achieved with those additional ion beam implants. Any tilt angle used in common implantation technics for semiconductor devices can be used in the beamline implants.

In some examples, the method of manufacturing Ohmic contacts on a SiC substrate comprises adaptation (e.g., specific adaption) of the concentration profile in the surface region of the SiC substrate. Generally, the concentration profile applied by a plasma deposition has a concentration maximum close to the interface of the SiC substrate to the metal layer, while the concentration continuously decreases with vertical expansion into the substrate layer. In some examples, however, the maximum of the concentration profile can be broadened such that it builds up a plateau with a vertical depth of at least 1 nanometer (nm), such as at least 5 nm, and/or in a range from about 10 nm to about 15 nm. The concentration profile can suitably be selected by the use of different conditions in the plurality of plasma deposition acts. Suitable conditions adjusted may be the ionizing rate, the implantation energies of the plasma, the implantation doses of the individual plasma depositions and so forth. Alternatively and/or additionally, the chemical composition of the substances to be deposited may be suitably adapted. For example, the plasma may be formed by using the pure elements, hydrides of the elements, or halogenides of the elements to be deposited. In case of P or B, for example, suitable plasmas may be formed from phosphine (PH3) or boron trifluoride (BF3) or difluoroboron (BF2). In combination with two or more different energy levels of the plasma deposition, multiple different concentration profiles (amounting to over a threshold quantity of different concentration profiles, for example) can be formed in line with the needs of the semiconductor devices to be manufactured. A specifically adjusted concentration profile, suitably with a high concentration of dopants in a region adjoining the interface from the substrate layer to the metal layer, leads to a bandgap narrowing. Thereby, the formation of a metal contact with low contact resistance on the prepared semiconductor substrates can be facilitated and results in low-cost manufacturing alternatives of Ohmic contacts on SiC based semiconductor devices.

In a second embodiment, the method of manufacturing Ohmic contacts on a silicon carbide (SiC) substrate, including substrates with at least one epitaxial layer deposited thereon, comprises the acts of providing a 4H—SiC or 6H—SiC substrate which may be the same as in the one or more of the embodiments described in the foregoing description, forming an amorphous layer in a surface region of the SiC substrate, performing first thermal annealing of the SiC substrate to recrystallize the amorphous layer into a crystalline or polycrystalline 3C—SiC layer, implanting dopants into the crystalline or polycrystalline 3C—SiC layer, performing second high temperature annealing (e.g., high thermal annealing, such as annealing performed at one or more temperatures exceeding a threshold temperature) of the 3C—SiC layer, and depositing a metal layer on the 3C—SiC layer (e.g., using the same or similar process using one or more of the techniques described in the present disclosure, such as with respect to the first embodiment and/or other embodiments provided herein). The second embodiment may be used for providing a front or rear side substrate layer for directly or indirectly depositing a metal layer thereon, thus forming an Ohmic contact of a semiconductor device. In the following, an example with p-doped substrate structures for a front side contact of SiC-based diodes or power MOSFET devices is described herein in greater detail. However, the same method may be applied for n-doped substrate structures as well without departing from the scope of the general technical principal disclosed herein.

In some examples, the substrate is a crystalline 4H—SiC or 6H—SiC substrate (and/or a mainly crystalline 4H—SiC or 6H—SiC substrate) and the epitaxial layer deposited on this substrate may comprise a plurality of device structures therein. In the second embodiment, an at least partly amorphous layer is formed in a front side surface region of the SiC substrate (e.g., the at least partly amorphous layer may be formed in an initial act of the second embodiment). At least partly does mean in this regard, that some parts or the total surface layer with a definite thickness are amorphized. At least some amorphous regions within the defined thickness of the surface layer of the SiC substrate are formed which may at least partly be recrystallized into a 3C—SiC layer by thermal annealing. The thermal annealing suitably is a thermal treatment of at least the amorphized regions within the surface layer of the SiC substrate. Exemplified temperatures for this first thermal annealing act are above 900° C., such as in a range from about 950° C. to about 1500° C. and/or in a range from about 1000° C. to about 1400° C. The formed 3C—SiC layer comprises (e.g., mainly comprises) crystalline or polycrystalline 3C—SiC polytype enabling the manufacturing of wide bandgap semiconductor devices with low contact resistance between the metallization and the semiconductor surface.

According to the second embodiment, the surface region of the SiC substrate has been modified such that the surface region (e.g., comprising one or more epitaxial layers) comprises 3C—SiC material into which suitable dopants may be implanted in subsequent acts into the wafer front side. The implantation act is however not limited, and any common implantation technique or the above-described implantation methods can be applied. Any combination of beamline implants or plasma depositions may be used depending on the intended application of the semiconductor device. A general principle of the method described herein is the separation of the formation of a 3C—SiC layer on a SiC substrate and the implantation of the dopants. This may avoid a reorientation of the implanted dopants that may occur during the thermal treatment for forming a 3C—SiC layer within a SiC substrate. In some examples, in processes of implanting high doses of dopants in the surface regions of 4H—SiC or 6H—SiC substrates, the recrystallization processes into 3C—SiC polytypes during a subsequent thermal activation act generally leads to a movement of the maximum concentration of dopants to the interface between the 4H—SiC or 6H—SiC surface and the 3C—SiC surface. Thus, the concentration of dopants at the surface to the metal contact layer may not be high enough or subsequent thinning acts are necessary. Hence, the method as described herein substantially prevents the movement of the dopants in the activation act because no recrystallization of the surface region of the SiC substrate takes place. Hence, the implanted concentration profile within the surface layer of the substrate, which already comprises (e.g., mainly comprises) 3C—SiC polytype material, is not substantially affected by the following additional acts such as further implantation acts or annealing acts for activating the implanted doping elements. Therefore, semiconductor substrates with 3C—SiC surface layers and high doping concentrations near the surface region for manufacturing semiconductor devices with reliable Ohmic contacts on the wafer front side and having a low contact resistance between the metallization and the semiconductor surface may be manufactured by the method of this embodiment.

In some embodiments, the method described herein comprises a second high temperature annealing for activating the implanted dopants. Suitable annealing temperatures for this act may be at least 1400° C., such as in a range from about 1600° C. to about 1800° C.

An act (e.g., a last act) of at least some of the embodiments provided herein is the deposition of a metal layer on the 3C—SiC layer provided before and implanted with dopants as described herein. The same or similar metallization acts may be applied using one or more of the techniques described in the present disclosure, such as with respect to the first embodiment and/or other embodiments provided herein. The formation of the 3C—SiC layer at the surface region with a high dopant concentration near the surface facilitates depositing a metal layer onto the 3C—SiC layer, thus resulting in a wide bandgap semiconductor device having a low contact resistance between the metallization and the semiconductor surface. The term "onto" in this regard again means that the metal layer may be deposited directly onto the surface region of the semiconductor substrate or on at least one intermediate layer such as a native oxide layer, for example.

In an example of the method described before, the act to create the crystalline or polycrystalline 3C—SiC layer is performed by laser thermal annealing processing. Thus, laser thermal annealing is used to provide the 4H—SiC or 6H—SiC substrate with a surface region comprising a 3C—SiC layer. The thermal treatment using laser beams with high energy may cause epitaxial rearrangements so that a crystalline or polycrystalline surface layer comprising 3C—SiC polytype (e.g., a crystalline or polycrystalline surface layer mostly comprising 3C—SiC polytype, such as where the 3C—SiC polytype may make up most of the crystalline or polycrystalline surface layer) is formed. Generally, the laser thermal annealing process results in a substrate structure with a monocrystalline 4H—SiC or 6H—SiC layer, a crystalline or polycrystalline 3C—SiC layer, a silicon layer, and a top carbon layer. The high energies used in the thermal annealing processes, for example in a range from about 3 joules (J)/cm$^{-2}$ to about 4 J/cm$^{-2}$, generally lead to decomposition reaction of the SiC crystal lattice. Laser conditions may be, for example, 3.8 J/cm$^{-2}$ at 308 nm and process durations of about 160 nanoseconds (ns). Alternative laser systems may be properly adapted when being used for thermal annealing processing according to this disclosure. Thus, the silicon and carbon layers formed above the epitaxially treated 3C—SiC surface region are formed by the decomposition products silicon and carbon. These additionally formed silicon and carbon layers may be used as energy filtering layers during the following implantation acts or sequence. Thus, higher implantation energies can be used because a part of the applied energy is filtered by these additional layers which enables to shift the doping maximum closer to the wafer surface enabling a good Ohmic contact. After the implantation of the doping material the silicon and the carbon layer will be removed.

In some examples, the implanting act comprises a plasma deposition of non-doping elements into the surface region of the crystalline or polycrystalline 3C—SiC layer, wherein at least one of the non-doping elements is germanium. Thereby, the doping or co-doping of germanium allows the tuning of the band gap structure. Thereby it may facilitate the Ohmic contact to p-type as well as n-type SiC with one single method as described above.

In other examples of the method as described in the second embodiment, an amorphous layer is formed by implanting dopants using an amorphizing dose into the surface region of the SiC substrate. A first implantation of Al, Ga (e.g., for p-doped substrates), or other doping elements or non-doping elements, such as Ar, Xe, Si can be used for at least partly forming amorphous regions within the surface region of the SiC substrate. During the subsequent first annealing act, the amorphized surface region of the SiC substrate may be recrystallized into the 3C—SiC surface layer, mainly comprising crystalline or polycrystalline 3C—SiC polytypes. Generally, the annealing act causes a recrystallisation of the SiC crystal lattice and a reorganization of the implanted dopants. In some examples, the maximum of the concentration of the doping elements moves close to the interface of the 4H—SiC or 6H—SiC layer and the 3C—SiC layer. Thus, the concentration of dopants at the surface of the substrate which shall be contacted with the metal contact layer in a subsequent act is lowered during the first annealing act. Hence, the Ohmic behavior of a formed metal contact layer can be insufficient for wide bandgap semiconductor devices. Therefore, the method of this embodiment comprises a subsequent implantation act for the doping elements used for providing a high concentration of dopants nearby the interface between the 3C—SiC layer and the metal contact layer to be provided onto the substrate. Those doping elements are also referred to as contact implants provided within the 3C—SiC layer. Any implantation method can be used for forming the implant within the surface region which is suitable for providing a high concentration (e.g., a concentration exceeding a threshold concentration) near this interface. Exemplified implantation techniques are beamline implants, plasma depositions, heat implants, e.g., implants performed at elevated temperatures (e.g., temperatures exceeding a threshold temperature) as described herein, and so forth. In some examples, a subsequent annealing act for the activation of these implanted dopants is required.

In some examples of the methods as described in this embodiment, an implanting act (e.g., the last implanting act) comprises at least one of a beamline implant or plasma deposition of doping elements into the surface region of the crystalline or polycrystalline 3C—SiC layer at elevated temperatures (e.g., temperatures exceeding a threshold temperature). The implantation doses and the implantation temperatures are, for example, selected such that an amorphization or a rearrangement of the doping elements are reduced and/or prevented (e.g., mostly prevented) in the second annealing act at high temperatures which is applied to activate the implanted dopants.

Suitable temperatures for the beamline implantation act may be selected to be in a range from about 150° C. to about 1000° C., such as in a range from about 300° C. to about 700° C.

In some examples, the formation of the contact implants is performed by multiple (e.g., two or more) plasma deposition acts with at least two different implantation energy levels using one or more of the techniques described in the present disclosure, such as with respect to the first embodiment and/or other embodiments provided herein. At least two different implantation energy levels mean that two, three, four or even more implantation energies can be used in several plasma deposition acts in order to implant higher concentration of dopants into the 3C—SiC layer provided. In this example, however, each plasma deposition act may have a lower energy level compared to examples in which the implantation is performed within one act. The concentration profile can, for example, be adjusted at the same time with a plateau shaped concentration profile near the interface between the 3C—SiC layer and the metal contact layer to be provided in one of the subsequent acts.

In some of the examples, a passivation layer or an external energy filter may be provided on the 3C—SiC layer or an intermediate layer before the second high temperature annealing act is performed. The passivation layer or the external energy filter may protect the 3C—SiC layer from high temperatures or high energies applied to the surface (during the second high temperature annealing act, for example). Exemplified passivation or energy filter layers are silicon layers and carbon layers which may be formed during the laser thermal annealing of a monocrystalline 4H—SiC or 6H—SiC substrate at the substrate surface, thus forming a 3C—SiC layer. In some examples, after a laser thermal annealing, there may be an overall layer structure comprising a monocrystalline layer, a crystalline or polycrystalline 3C—SiC-layer, a silicon layer, and a carbon layer provided on the monocrystalline substrate (e.g., the treated monocrystalline substrate). The silicon and carbon layers are useful as energy filters during the implantation act into the 3C—SiC layer. After the implantation act and suitably before the high temperature annealing act, the silicon and carbon layers may be removed or abraded, and the contact layer may be provided on the 3C—SiC layer with high concentration of implanted dopants near the surface. Thus, a reliable metal contact layer with a low contact resistance can be manufactured on a SiC substrate.

Alternatively and/or additionally, the silicon and or the carbon layers may be removed after the laser thermal annealing act if an energy filtering layer is not needed during the subsequent implantation acts, for example if one or more plasma deposition acts are performed at sufficiently low energy levels (e.g., energy levels lower than a threshold energy level). For enabling the use of higher energy levels to be applied during the implantation act, such as when using a beamline implantation or hot implantation act, the method may comprise the act of applying an energy filtering layer on the SiC substrate. Applying an energy filtering layer may comprise the act of applying a new energy filtering layer on the stack of layers, the use of an external energy filter, or the thickening of one of the already provided layers, such as the silicon layer. Two or more of these alternatives may be combined as well. For example, the carbon layer formed during the laser thermal annealing may be removed and then the silicon layer will be thickened by suitable silicon crystal growths techniques.

Some examples of the methods described herein may comprise an act of providing a barrier layer onto the substrate, such as onto an epitaxial layer as substrate for front side contacts, or an intermediate layer before or after the act of forming the contact implants. Those barrier layers may prevent the dopants from diffusion out of the substrate layer, comprising, if applicable, an epitaxial layer, during the annealing acts at elevated temperatures. Depending on the temperatures and the dopants used, some parts of the dopants are diffused out of the substrate layer in conventional processes. Thus, the provision of a barrier layer over the 3C—SiC layer may significantly reduce the outdiffusion processes of the dopants. Examples of barrier layers are materials with a good stability (e.g., threshold amount of stability) at high temperatures (e.g., temperatures higher than a threshold) such as layers made of graphene. In some examples, graphene layers block at least some of (e.g., most of) the diffusion of Al atoms. In some examples, a graphene layer is provided after the epitaxial deposition of drift zone layers by specific annealing acts at higher temperatures. Those graphene barrier layers may be present in the device layers while further processing of the substrate by forming the Ohmic contacts, for example. Alternative examples of barrier materials are Al2O3 or Si3O4. In contrast to the graphene layers, those layers may be removed before further processing of the substrate because they are not stable for the high annealing temperature used for activating the dopants in the methods described herein.

In some embodiments described herein, the metal layer used as the contact layer comprises a metal content or a content of a metal compound of more than 98%, and the metal or metal compound is selected from the group of Al, titanium (Ti), tantalum (Ta), tungsten (W), molybdenum (Mo), nickel (Ni), nickel aluminide (NiAl), titanium nitride (TiN), tantalum nitride (TaN), molybdenum nitride (MoN), tungsten nitride (WN), and nickel silicide (NiSi). Metal compounds may be metal nitrides or metal silicides but may also comprise other nonmetal components. In case of NiSi, the Si content of the NiSi may be less than 15%, such as in a range from about 10% to about 12%, such as about 11%.

In an example, the metal layer comprises one or more first materials comprising one or more metals and/or one or more metal compounds. The one or more first materials (e.g., the one or more metals and/or the one or more metal compounds) may be present, in the metal layer, at more than 98%. For example, the one or more first materials (e.g., the one or more metals and/or the one or more metal compounds) may make up more than 98% of the metal layer. The one or more first materials may comprise Al, Ti, Ta, W, Mo, Ni, NiAl, TiN, TaN, MoN, WN, and/or NiSi.

According to a third embodiment, a method of manufacturing a semiconductor device is disclosed. The semiconductor device has a structure of at least three layers comprising a 4H—SiC layer, a 3C—SiC layer, and a metal layer. The method of the third embodiment comprises the act of manufacturing an Ohmic contact on a silicon carbide (SiC) substrate as defined in any of the embodiments and examples described herein. The use of the higher valence band level of the 3C—SiC material compared to monocrystalline polytypes 4H—SiC or 6H—SiC in the semiconductor devices obtained by this method allows the manufacturing of semiconductor devices with a low contact resistance because of the 3C—SiC layer at the interface of the substrate and the metal contact layer. The direct formation of the 3C—SiC layer at the interface is reproducible without the need of subsequent acts such as thinning acts of the substrate or epitaxial layers to shift the doping maximum close to the semiconductor/metal interface, or the like. Moreover, the 3C—SiC layer is formed and maintained independently of the subsequent implantation acts or activation acts. Thus, a reliable Ohmic contact with small bandgap and reproducible and low contact resistance is created at the interface between the substrate and the metal layer at low costs.

It may be appreciated that, in some implementations, techniques described herein with respect to the first embodiment, the second embodiment and/or the third embodiment (and/or other embodiments provided herein) may be combined.

The methods described in the embodiments herein are suitable to provide a semiconductor device. According to an embodiment, the semiconductor device has a structure of at least three layers comprising a 4H—SiC layer, a 3C—SiC layer, and a metal layer, wherein the maximum of the concentration of dopants in the 3C—SiC layer is less than 30 nm, such as less than 20 nm and/or less than 10 nm away from the interface of the metal layer and the 3C—SiC layer. For example, a region, in the 3C—SiC layer, having the maximum concentration of dopants in the 3C—SiC layer is less than 30 nm away (such as less than 20 nm and/or less than 10 nm) from the interface of the metal layer and the 3C—SiC layer (e.g., a distance between the region and the interface is less than 30 nm, such as less than 20 nm and/or less than 10 nm). These semiconductor devices are suitably used as wide bandgap semiconductor devices having good Ohmic contacts due to the high concentration of dopants near the interface to the metal contact layer. In some examples, the metal layer comprises a metal content or a content of a metal compound of more than 98%, and the metal or the metal compound is selected from the group of Al, Ti, Ta, W, Mo, Ni, NiAl, TiN, TaN, MoN, WN, and NiSi. In an example, the metal layer comprises one or more first materials comprising one or more metals and/or one or more metal compounds. The one or more first materials (e.g., the one or more metals and/or the one or more metal compounds) may be present, in the metal layer, at more than 98%. For example, the one or more first materials (e.g., the one or more metals and/or the one or more metal compounds) may make up more than 98% of the metal layer. The one or more first materials may comprise Al, Ti, Ta, W, Mo, Ni, NiAl, TiN, TaN, MoN, WN, and/or NiSi. Exemplified semiconductor devices with device structures are Power-MOSFETs or diodes. In such semiconductor devices the 3C—SiC layer may be a n-type or p-type epitaxial or polycrystalline layer. N-doped source zones and p-doped body or emitter zones may be prepared at the front side and highly n-doped contact layers may be prepared at the rear side depending on the semiconductor device produced.

Figure 1:
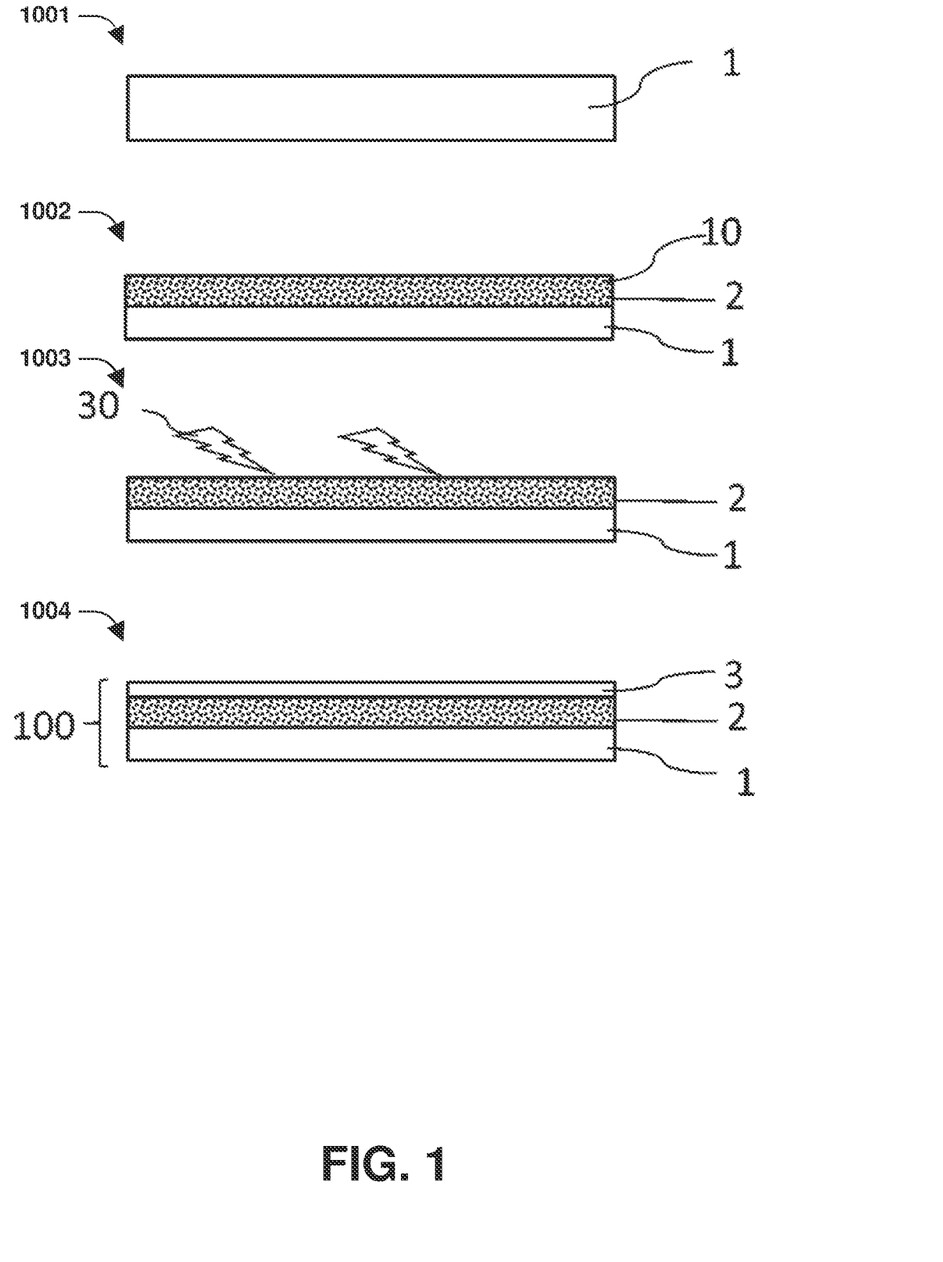
FIG. 1 illustrates an exemplary embodiment of a method of manufacturing Ohmic contacts on a silicon carbide (SiC) substrate comprising a plasma deposition and an annealing act.

The above-described embodiments will be further described by referring to the drawings which show specific examples of the methods and semiconductor devices obtained therewith. Referring now to FIG. 1 an exemplary embodiment of a method of manufacturing Ohmic contacts on a SiC substrate at the rear side or the SiC epitaxial layers at the frontside of a wafer substrate to be processed comprising a plasma deposition and an annealing act (as described with respect to the first embodiment, for example) is shown. FIG. 1 illustrates a cross-section of a monocrystalline SiC substrate layer 1 made, for example, from a 4H—SiC or 6H—SiC material (e.g., the monocrystalline SiC substrate layer 1 may be made mainly from the 4H—SiC or 6H—SiC material). At act 1001, the monocrystalline SiC substrate layer 1 may be provided. At act 1002, a plasma deposition of dopants 10 (e.g., P or N) is performed to create a doped layer within a surface region 2. In order to adjust the concentration profile within this doped layer, two or more plasma depositions acts are performed, while each of the plurality of acts is performed with a different implantation energy level, that means at least a different implantation energy or implantation dose.

At act 1003, annealing of at least the surface region 2 of the substrate or epitaxial layer may be performed by elevating the temperature of the substrate (shown by the lightnings 30) for activating the dopants. In some examples, the doped surface material undergoes a recrystallization from the at least partially amorphous regions after the implantation into a crystalline or polycrystalline 3C—SiC layer 2 (e.g., the doped surface material undergoes the recrystallization from the at least partially amorphous regions after the implantation into the crystalline or polycrystalline 3C—SiC layer 2 after the act 1003). At act 1004, a metal contact layer 3 is deposited onto the obtained substrate with the 3C—SiC layer 2 (e.g., the 3C—SiC layer 2 is at the interface between the substrate surface and the metal contact layer 3). The act 1004 may be after act 1003 and/or after the doped surface material undergoes the recrystallization from the at least partially amorphous regions after the implantation into the crystalline or polycrystalline 3C—SiC layer 2. The obtained Ohmic contacts are suitable for semiconductor devices 100 with wide bandgap properties due to the smaller bandgap of the 3C—SiC polytype layer 2 compared to the monocrystalline substrate layer 1, which is further promoted by the bandgap narrowing induced by the high doping level realized by the plasma deposition process.

Figure 2:
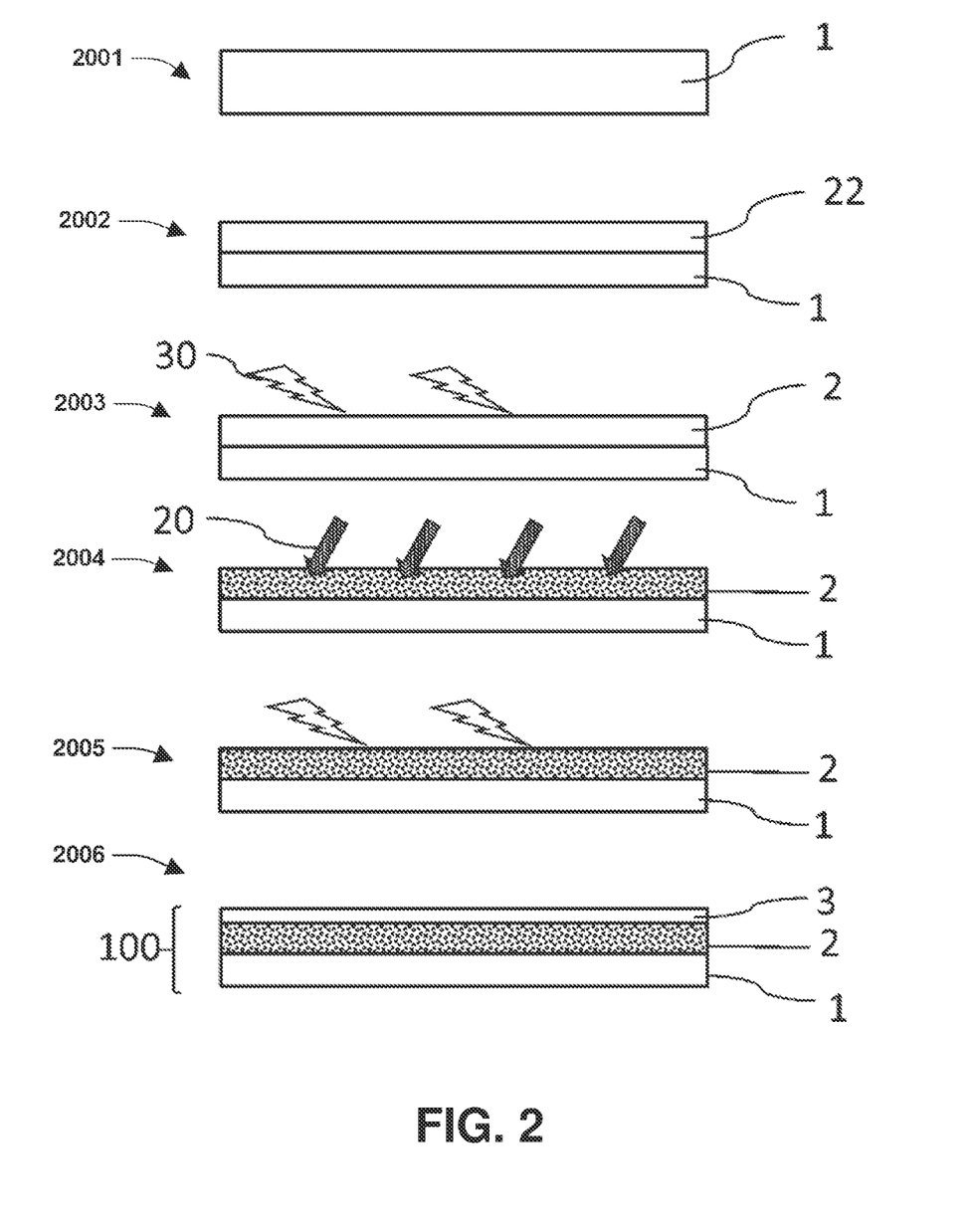
FIG. 2 illustrates an exemplary embodiment of a method of manufacturing Ohmic contacts on a SiC substrate comprising two annealing acts.

Referring now to FIG. 2, an exemplary embodiment of a method of manufacturing Ohmic contacts on a SiC substrate is shown. The example shown in FIG. 2 may be suitable for the realization of a frontside contact on a substrate, such as on epitaxial layers comprised at the surface of a wafer substrate. In this method two annealing acts (shown with the lightnings 30) are applied (e.g., act 2003 and act 2005). In some examples, at 2001, a monocrystalline SiC substrate 1, such as a SiC substrate made of 4H—SiC or 6H—SiC, is provided (e.g., providing the monocrystalline SiC substrate 1 may be an initial act of the exemplary embodiment shown in FIG. 2). At 2002, the surface of the substrate 1 is at least partly amorphized (e.g. by beamline implanting of dopants or non-doping elements), thereby forming an amorphous layer 22 within the surface region of substrate 1. At act 2003, the amorphous layer 22 is thermally treated by using thermal annealing at a temperature in, for example, a range from about 950° C. to about 1500° C. and/or in a range from about 1000° C. to about 1400° C., thus forming a 3C—SiC layer 2 within the surface region of the substrate 1 by recrystallization processes. In some examples, the act 2003 may be performed after or at the same time as the act 2002.

At act 2004, dopants are implanted into the surface region of the 3C—SiC layer 2 for providing the contact implants, whereby amorphization of the implanted layer may be (e.g., must be) avoided in a significant degree (e.g., amorphization shall be totally avoided). The act 2004 may be performed with a temperature in, for example, a range from about 150° C. to about 1000° C. or in a range from about 300° C. to about 700° C. At act 2005, a second thermal annealing act at higher temperatures (e.g., in a range from about 1600° C. to about 1800° C.) for activating the contact implants in the surface region of the 3C—SiC layer 2 is performed before the metal contact layer 3 is deposited, at act 2006, onto the 3C—SiC layer 2 to provide Ohmic contacts on the substrate 1. The obtained semiconductor device 100 includes a 4H—SiC or 6H—SiC substrate layer 1, a 3C—SiC layer 2, and a metal contact layer 3.

Figure 3:
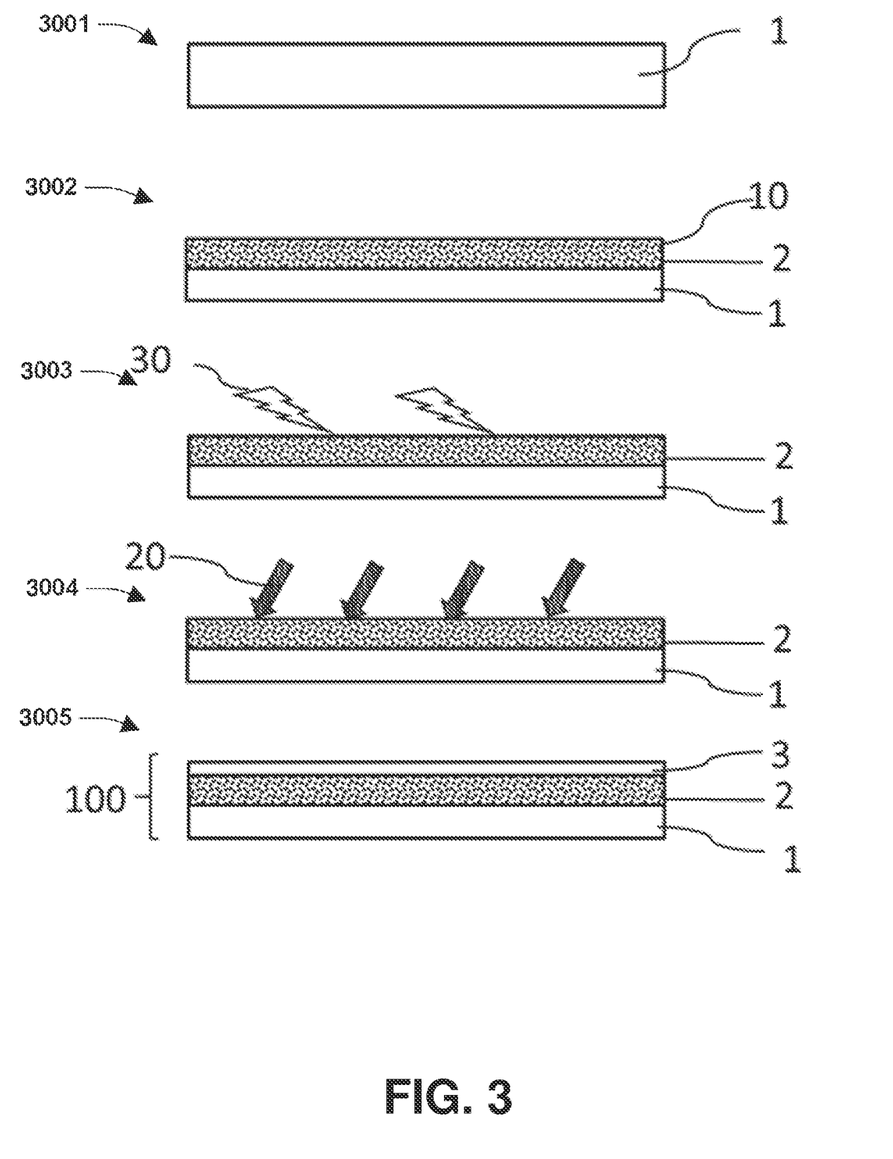
FIG. 3 illustrates a further exemplary embodiment of a method of manufacturing Ohmic contacts on a SiC substrate including, among others, a beamline implanting act with tilted angel.

Referring to FIG. 3, a further exemplary embodiment of a method of manufacturing Ohmic contacts on a SiC substrate contains an additional beamline implanting act with tilted angel (indicated by arrows 20). Acts 3001, 3002, and 3003 shown in FIG. 3 may be identical or similar to acts 1001, 1002, and 1003 shown in FIG. 1, respectively. After the first annealing act 3003 at elevated temperatures at least at the surface region of the 3C—SiC layer 2 for activating the dopants, further beamline implanting acts with a tilted angel (see arrows 20) are performed at act 3004 to deepen the concentration profile at the surface region of the 3C—SiC layer 2 within the substrate 1. The tilt angle can be varied during the beamline implantation act depending on the application of the semiconductor device 100 to be produced. At act 3005, metal contact layers 3 are deposited onto the 3C—SiC layer 2 to produce the Ohmic contacts.

Figure 4:
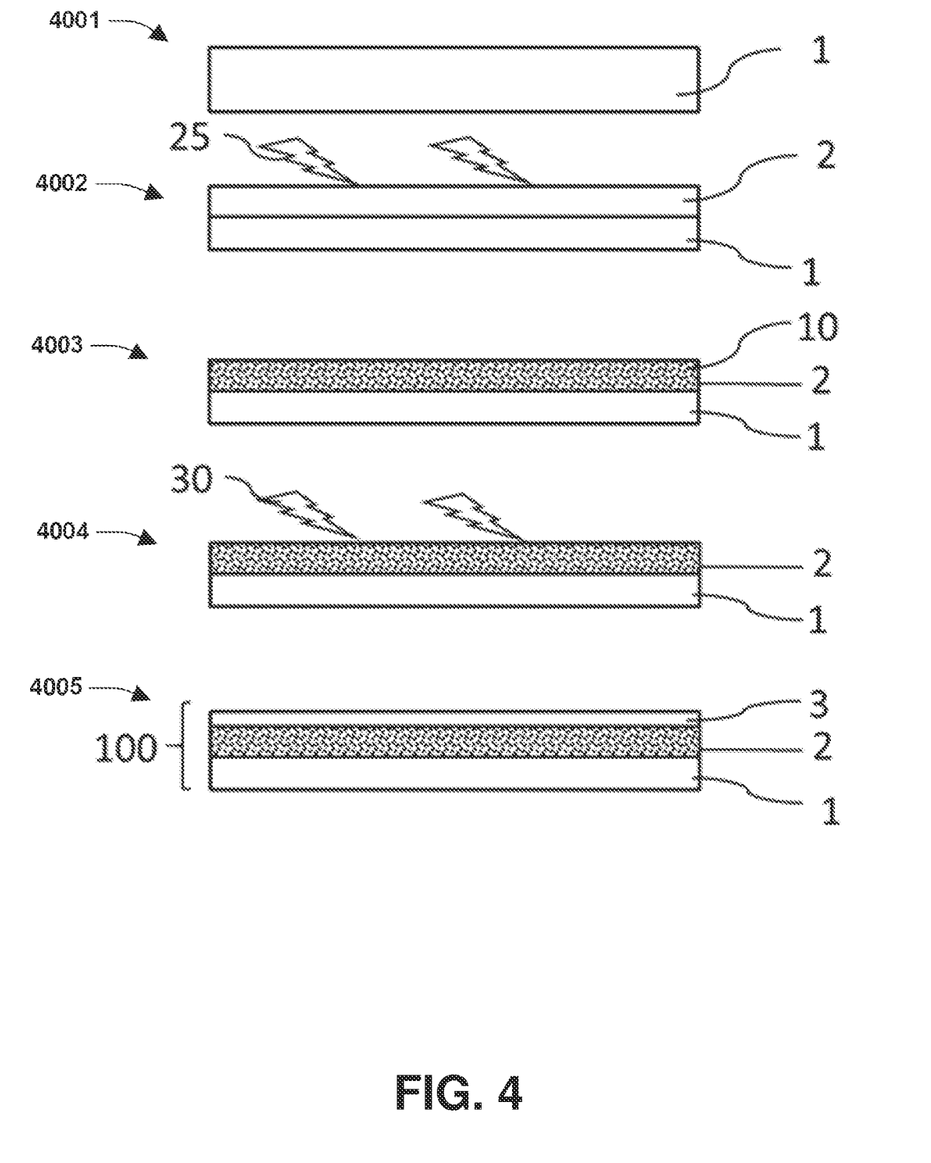
FIG. 4 illustrates a further exemplary embodiment of a method of manufacturing Ohmic contacts on a SiC substrate including a laser thermal annealing process.

Referring to FIG. 4, an exemplary embodiment of a method of manufacturing Ohmic contacts on a SiC substrate, such as frontside contacts on epitaxial layers comprised at the surface of a wafer substrate, is shown. At act 4001, a monocrystalline SiC substrate 1, such as a SiC substrate made of 4H—SiC or 6H—SiC, is provided. At act 4002, the surface of the substrate 1 is treated by laser thermal annealing 25, thus forming a crystalline or polycrystalline 3C—SiC layer 2 within the surface region of the substrate 1 by recrystallization processes. As shown in the FIG. 4, the laser thermal annealing 25 leads to a substrate stack of a 4H—SiC or 6H—SiC-layer 1, a 3C—SiC layer 2, a Si layer 5 (not shown) and a C layer 7 (not shown). The Si and C layers 5 and 7 are formed by decomposition reactions at the surface of the substrate. The Si and C layers 5 and 7 can be used as energy absorbing layers for the subsequent implanting act (as shown in this example) or may be removed (e.g., removed before the subsequent implanting act). In some examples, energy absorbing layers are used to protect the structures behind the surface region of the substrate for high energies. Therefore, the Si and C layers 5 and 7 are removed by thinning procedures after the implanting act. Alternatively and/or additionally, the Si and C layers 5 and 7 may be removed (at the latest, for example) before a high temperature annealing act is performed, such as due, at least in part to a low temperature stability of Si and C.

At act 4003, dopants 10 are implanted into the surface region of the 3C—SiC layer 2 for providing the contact implants, whereby amorphization of the implanted layer may be (e.g., must be) avoided in a significant degree (e.g., amorphization shall be totally avoided). The act 4003 may be performed with a temperature in a range from about 150° C. to about 1000° C. or in a range from about 300° C. to about 700° C. At act 4004, a second thermal annealing act 30 at higher temperatures (e.g., in a range from about 1600° C. to about 1800° C.) for activating the contact implants 10 in the surface region of the 3C—SiC layer 2 is performed. If energy absorbing layers are used as shown in this example, the Si and C layers 5 and 7 are removed by typical ablation or thinning processes.

At act 4005 (after the act 4005, for example), a metal contact layer 3 is deposited onto the 3C—SiC layer 2 to provide Ohmic contacts on the substrate 1. The obtained semiconductor device 100 includes a 4H—SiC or 6H—SiC substrate layer 1, a 3C—SiC layer 2, and a metal contact layer 3. The Ohmic contacts between the 3C—SiC layer 2 and the metal layer 3 have a low contact resistance due to the small bandgap provided by the highly doped 3C—SiC layer obtained by the herein used process.

According to an embodiment, a method of manufacturing a semiconductor device having a structure of at least three layers comprising a 4H—SiC or 6H—SiC layer, a 3C—SiC layer, and a metal layer is described herein, comprising the act of manufacturing an Ohmic contact on a silicon carbide (SiC) substrate as defined in any of the preceding embodiments and examples.

According to a further embodiment, the description refers to a semiconductor device having a structure of at least three layers comprising a 4H—SiC or 6H—SiC layer, a 3C—SiC layer, and a metal layer, wherein the maximum of the concentration of dopants in the 3C—SiC layer is less than 30 nm away from the interface of the metal layer and the 3C—SiC layer. For example, a region, in the 3C—SiC layer, having the maximum concentration of dopants in the 3C—SiC layer is less than 30 nm away (such as less than 20 nm and/or less than 10 nm) from the interface of the metal layer and the 3C—SiC layer (e.g., a distance between the region and the interface is less than 30 nm, such as less than 20 nm and/or less than 10 nm).

According to a further embodiment, a semiconductor device is described herein, wherein the metal layer comprises a metal content or a content of a metal compound of more than 98%, and the metal or the metal compound is selected from the group consisting of Al, Ti, Ta, W, Mo, Ni, NiAl, TiN, TaN, MoN, WN, and NiSi. In an example, the metal layer comprises one or more first materials comprising one or more metals and/or one or more metal compounds. The one or more first materials (e.g., the one or more metals and/or the one or more metal compounds) may be present, in the metal layer, at more than 98%. For example, the one or more first materials (e.g., the one or more metals and/or the one or more metal compounds) may make up more than 98% of the metal layer. The one or more first materials may comprise Al, Ti, Ta, W, Mo, Ni, NiAl, TiN, TaN, MoN, WN, and/or NiSi.

According to yet a further embodiment, a semiconductor device is described herein, wherein the 3C—SiC layer (2) is a n-type or p-type epitaxial or polycrystalline layer.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments and examples shown and described without departing from the scope of the present disclosure. The present disclosure is intended to cover any adaptations or variations of the specific embodiments discussed herein. Therefore, it is intended that this disclosure be limited only by the claims and the equivalents thereof.

The invention claimed is:

1. A method of manufacturing Ohmic contacts on a silicon carbide (SiC) substrate, the method comprising:
    providing a SiC substrate, wherein the SiC substrate is a 4H—SiC substrate or a 6H—SiC substrate;
    implanting dopants into a surface region of the SiC substrate;
    annealing the surface region to form a 3C—SiC layer; and
    depositing a metal layer on the 3C—SiC layer,
    wherein an implanting sequence of the implanting the dopants comprises a plurality of plasma deposition acts with implantation energy levels comprising at least two different implantation energy levels, and wherein the implantation energy levels of the plurality of plasma deposition acts and one or more implantation doses of the plurality of plasma deposition acts are selected to form a 3C-SiC layer in the surface region of the SiC substrate during the annealing.

2. The method according to claim 1, wherein the surface region comprises at least partially amorphous SiC.

3. The method according to claim 2, wherein a temperature of the annealing is set to induce an at least partial recrystallization of the at least partially amorphous SiC in the surface regions to form the 3C—SiC layer comprising at least one of crystalline 3C—SiC or polycrystalline 3C—SiC.

4. The method according to claim 1, wherein the annealing is performed via a laser annealing process or a furnace annealing process.

5. The method according to claim 1, wherein the implanting comprises implanting at least two different dopant types, wherein one or more first dopant types of the at least two different dopant types comprises doping elements.

6. The method according to claim 5, wherein the doping elements comprise at least one of nitrogen (N), phosphorus (P), germanium (Ge), selenium (Se), sulfur(S), aluminum (Al), gallium (Ga), or boron (B).

7. The method according to claim 5, wherein one or more second dopant types of the at least two different dopant types comprises one or more non-doping elements.

8. The method according to claim 7, wherein the one or more non-doping elements comprise germanium (Ge).

9. The method according to claim 1, comprising performing one or more beamline implantation acts, wherein the one or more beamline implantation acts are performed with one or more tilted ion beams.

10. A method of manufacturing Ohmic contacts on a silicon carbide (SiC) substrate, the method comprising:
    providing a SiC substrate, wherein the SiC substrate is a 4H—SiC substrate or a 6H—SiC substrate;
    forming an amorphous layer in a surface region of the SiC substrate;
    performing first thermal annealing of the SiC substrate to recrystallize the amorphous layer into a 3C—SiC layer comprising at least one of crystalline 3C—SiC or polycrystalline 3C—SiC;
    after performing the first thermal annealing of the SiC substrate to recrystallize the amorphous layer into the 3C—SiC layer, implanting dopants into the 3C—SiC layer;
    performing second thermal annealing of the 3C—SiC layer; and
    depositing a metal layer on the 3C—SiC layer.

11. The method according to claim 10, wherein the forming the amorphous layer comprises implanting dopants, using an amorphizing dose, into the surface region of the SiC substrate.

12. A method of manufacturing Ohmic contacts on a silicon carbide (SiC) substrate, the method comprising:
    providing a SiC substrate, wherein the SiC substrate is a 4H—SiC substrate or a 6H—SiC substrate;
    forming a 3C—SiC layer, comprising at least one of crystalline 3C—SiC or polycrystalline 3C—SiC, in a surface region of the SiC substrate using laser thermal annealing processing;

after forming the 3C—SiC layer, implanting dopants into the 3C—SiC layer;
performing second thermal annealing of the 3C—SiC layer; and
depositing a metal layer on the 3C—SiC layer.

13. The method according to claim 12, wherein a silicon (Si) layer and a carbon (C) layer are formed on the 3C—SiC layer, at the surface region of the SiC substrate, during the laser thermal annealing processing, wherein the Si layer and the C layer are removed before the second thermal annealing is performed.

14. The method according to claim 12, wherein the implanting comprises performing a plasma deposition of one or more non-doping elements into a surface region of the 3C—SiC layer, wherein the one or more non-doping elements comprise germanium (Ge).

15. The method according to claim 12, wherein the implanting comprises performing at least one of:
a beamline implant of doping elements into a surface region of the 3C—SiC layer at one or more first temperatures; or
plasma deposition of doping elements into the surface region of the 3C—SiC layer at the one or more first temperatures.

16. The method according to claim 15, wherein the one or more first temperatures are set to one or more temperatures between 150° C. and 1000° C.

17. The method according to claim 15, wherein the plasma deposition comprises multiple plasma deposition acts with implantation energy levels comprising at least two different implantation energy levels.

18. The method according to claim 12, comprising forming, before the second thermal annealing is performed, a passivation layer on at least one of the 3C—SiC layer or a layer over the 3C—SiC layer.

19. The method according to claim 12, comprising applying, before the implanting is performed, an energy filtering layer on at least one of the SiC substrate or a layer over the SiC substrate.

20. The method according to claim 12, wherein:
the metal layer comprises one or more first materials comprising at least one of one or more metals or one or more metal compounds;
the one or more first materials are present in the metal layer at more than 98%; and
the one or more first materials comprise at least one of aluminum (Al), titanium (Ti), tantalum (Ta), tungsten (W), molybdenum (Mo), nickel (Ni), nickel aluminide (NiAl), titanium nitride (TiN), tantalum nitride (TaN), molybdenum nitride (MoN), tungsten nitride (WN), and nickel silicide (NiSi).

21. A method of manufacturing Ohmic contacts on a silicon carbide (SIC) substrate, the method comprising:
providing a SiC substrate, wherein the SiC substrate is a 4H—SiC substrate or a 6H—SiC substrate;
implanting dopants into a surface region of the SiC substrate; and
annealing the surface region to form a 3C—SiC layer,
wherein an implanting sequence of the implanting the dopants comprises a plurality of plasma deposition acts with implantation energy levels comprising at least two different implantation energy levels.

22. The method according to claim 21, wherein the implantation energy levels of the plurality of plasma deposition acts and one or more implantation doses of the plurality of plasma deposition acts are selected to form a 3C—SiC layer in the surface region of the SiC substrate during the annealing.

23. The method according to claim 21, comprising depositing a metal layer on the 3C—SiC layer.

* * * * *